(12) United States Patent
Park

(10) Patent No.: US 9,147,478 B2
(45) Date of Patent: Sep. 29, 2015

(54) SEMICONDUCTOR MEMORY DEVICE AND METHOD OF OPERATING THE SAME

(71) Applicant: SK Hynix Inc., Icheon-si, Gyeonggi-do (KR)

(72) Inventor: Jung Ho Park, Cheongju-si (KR)

(73) Assignee: SK HYNIX INC., Icheon-si, Gyeonggi-Do (KR)

( * ) Notice: Subject to any disclaimer, the term of this patent is extended or adjusted under 35 U.S.C. 154(b) by 170 days.

(21) Appl. No.: 14/021,669

(22) Filed: Sep. 9, 2013

(65) Prior Publication Data

US 2014/0340966 A1    Nov. 20, 2014

(30) Foreign Application Priority Data

May 16, 2013   (KR) .................. 10-2013-0055585

(51) Int. Cl.
  *G11C 16/04*  (2006.01)
  *G11C 16/14*  (2006.01)
  *G11C 16/16*  (2006.01)
  *G11C 16/34*  (2006.01)

(52) U.S. Cl.
  CPC ............ *G11C 16/14* (2013.01); *G11C 16/0483* (2013.01); *G11C 16/16* (2013.01); *G11C 16/344* (2013.01)

(58) Field of Classification Search
  CPC .... G11C 16/04; G11C 16/14; G11C 16/0483; G11C 16/16; G11C 16/344; G11C 16/3427
  USPC ............. 365/185.17, 185.05, 185.11, 185.18, 365/185.22, 185.29
  See application file for complete search history.

(56) References Cited

U.S. PATENT DOCUMENTS

| 8,372,720 B2 * | 2/2013 | Fukuzumi et al. ............ 438/287 |
| 8,824,211 B1 * | 9/2014 | Costa et al. ............... 365/185.22 |
| 2010/0207195 A1 * | 8/2010 | Fukuzumi et al. ............ 257/326 |
| 2013/0141971 A1 * | 6/2013 | Hosono .................... 365/185.02 |

FOREIGN PATENT DOCUMENTS

KR        1020120043517        5/2012

\* cited by examiner

*Primary Examiner* — Gene Auduong
(74) *Attorney, Agent, or Firm* — Lowe Hauptman & Ham, LLP

(57) ABSTRACT

A semiconductor memory device includes a memory string and a peripheral circuit. The memory string has a pipe cell, a plurality of memory cells, and at least one channel layer having a three-dimensional U-shaped structure. The peripheral circuit is configured to perform an erase operation on the pipe cell. A method of operating the semiconductor memory device includes selecting the memory string and performing the erase operation on the pipe cell.

15 Claims, 8 Drawing Sheets

SEMICONDUCTOR MEMORY DEVICE AND METHOD OF OPERATING THE SAME

CROSS-REFERENCE TO RELATED APPLICATION

The present application claims priority to Korean patent application number 10-2013-0055585, filed on May 16, 2013, which is incorporated herein by reference in its entirety.

TECHNICAL FIELD

The present disclosure is related in some aspects to an electronic device and, more particularly, to a semiconductor memory device and a method of operating the same.

BACKGROUND

A semiconductor memory device is classified as a volatile memory device or a nonvolatile memory device.

The volatile memory device performs a high speed data read and write operation, but the stored data is lost when the power is cut off. The non-volatile memory device operates at relatively lower write and read speeds, but the stored data is preserved even when the power is cut off. Therefore, the non-volatile memory device is used to store data that is to be maintained regardless of power supply. Examples of the non-volatile memory device include a read only memory (ROM) device, a programmable ROM (PROM) device, an electrically programmable ROM (EPROM) device, an electrically erasable and programmable ROM (EEPROM) device, a flash memory device, a phase-change RAM (PRAM) device, a magnetic RAM (MRAM) device, a resistive RAM (RRAM) device, a ferroelectric RAM (FRAM) device, or the like. The Flash memory device is typically divided into a NOR device and a NAND device.

The flash memory device enjoys the advantages of both RAM and ROM devices. For example, the flash memory device can be freely programmed and erased similar to the RAM device. Similar to the ROM device, the flash memory device can retain the stored data even when they are not powered. The flash memory device has been widely used as the storage media of portable electronic devices such as mobile phones, digital cameras, personal digital assistants (PDAs), and MP3 players.

The size of a memory device is to be reduced in order to increase the degree of integration of a memory. However, semiconductor materials or processing conditions limit reduction in size of memory devices. Recently, there have been proposals of three-dimensional (3D) structured memory devices. In a 3D semiconductor memory device, cell current stability is a design consideration.

SUMMARY

In one or more embodiments, a semiconductor memory device includes a memory string and a peripheral circuit. The memory string includes a pipe cell, a plurality of memory cells, and a channel layer having a three-dimensional U-shaped structure. The memory cells are arranged in series between a bit line and the pipe cell and between a source line and the pipe cell in a vertical direction to the pipe cell. The peripheral circuit is configured to perform an erase operation on the pipe cell.

In accordance with one or more embodiments, a method of operating a semiconductor memory device includes selecting a memory string in the semiconductor memory device. The memory string includes a pipe cell, a plurality of memory cells, and a channel layer having a three-dimensional U-shaped structure. The memory cells are arranged in series between a bit line and the pipe cell and between a source line and the pipe cell in a vertical direction to the pipe cell. The method further includes performing an erase operations on the pipe cell.

In one or more embodiments, a semiconductor memory device includes a substrate, a memory string and a peripheral circuit 18. The memory string includes a pipe cell formed on the substrate, a plurality of memory cells, and a channel layer. The plurality of memory cells includes first and second groups of memory cells. The of memory cells is arranged in series between a bit line and the pipe cell in a vertical direction to the substrate. The second group of memory cells is arranged in series between a source line and the pipe cell in the vertical direction to the substrate. The channel layer extends along the memory string from the memory cells in the first group to the pipe cell then to the memory cells in the second group. The peripheral circuit is configured to perform an erase operation on the pipe cell.

BRIEF DESCRIPTION OF THE DRAWINGS

One or more embodiments are illustrated by way of example, and not by limitation, in the figures of the accompanying drawings.

DETAILED DESCRIPTION

Figure 1:
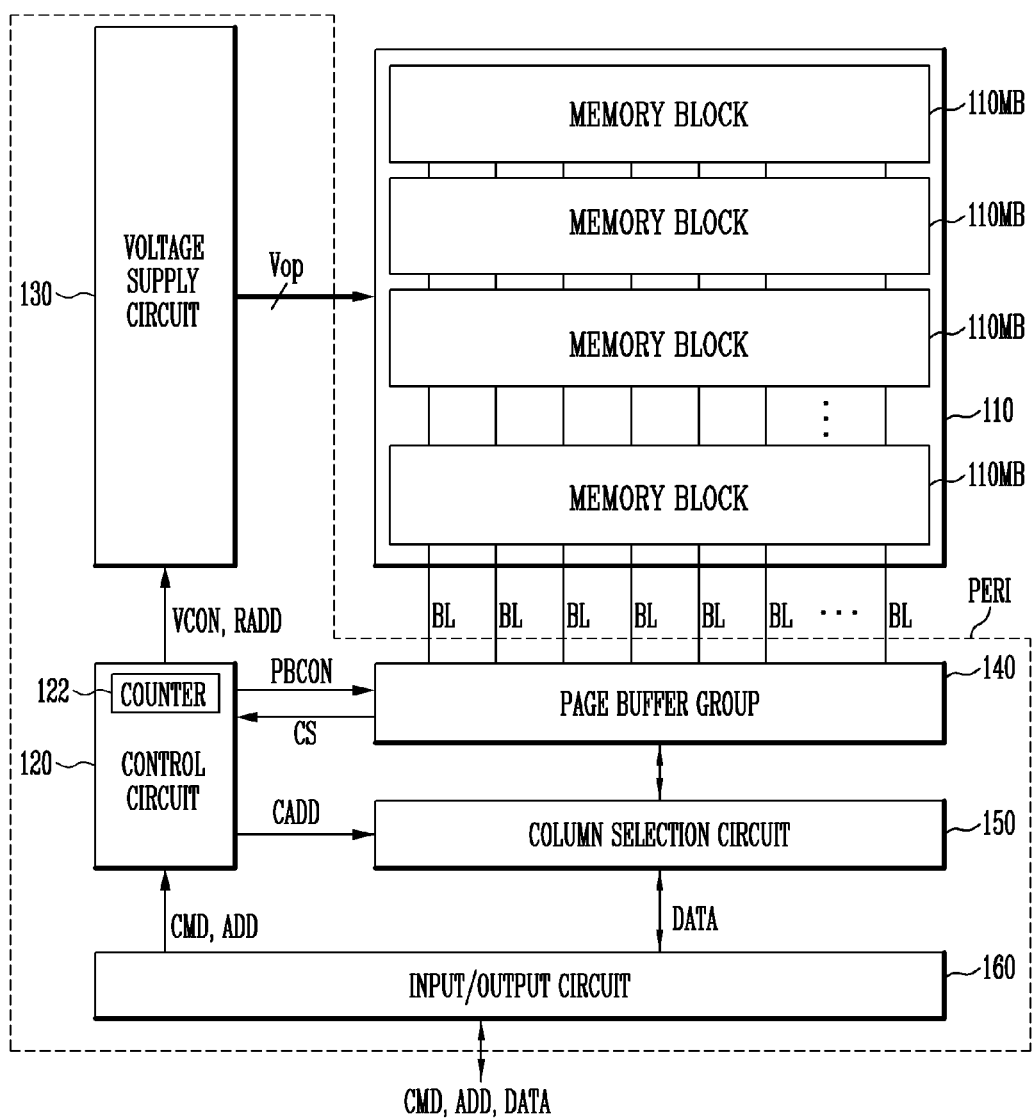
FIG. 1 is a block diagram of a semiconductor memory device according to some embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
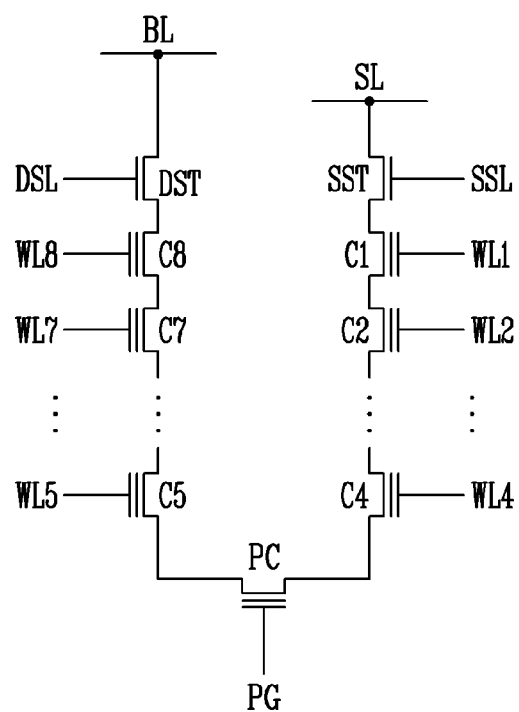
FIG. 2 is a circuit diagram of a memory string included in a memory block illustrated in FIG. 1.

FIG. 1 is a block diagram of a semiconductor memory device according to some embodiments of the present disclosure. FIG. 2 is a circuit diagram of a memory string included in a memory block illustrated in FIG. 1.

Referring to FIG. 1, the semiconductor memory device according to some embodiments of the present disclosure includes a memory array 110 and a peripheral circuit PERI. The memory array 100 includes a plurality of memory blocks 110 MB. The peripheral circuit PERI is configured to perform an erase operation and an erase verify operation on memory cells and pipe cells included in a selected page of a memory block. The peripheral circuit PERI includes a control circuit 120, a voltage supply circuit 130, a page buffer group 140, a column selection circuit 150 and an input/output circuit 160.

Each memory block includes one or more memory strings. Each of the memory strings includes a pipe cell and a plurality of memory cells. The memory cells are arranged in series between a bit line and the pipe cell and between a source line and the pipe cell in a vertical direction to the pipe cell. Each of the memory strings includes a channel layer having a three-dimensional U-shaped structure.

Referring to FIG. 2, a memory string in accordance with some embodiments includes a drain select transistor DST having a drain coupled to a bit line BL, a source select transistor SST having a source coupled to a source line SL, and memory cells C1 to C8 coupled in series between the drain select transistor DST and the source select transistor SST. The number of memory cells is variable according to different design needs. Hereinafter, one example will be described with reference to a case in which there are eight memory cells in each memory string.

A pipe cell PC is coupled between a pair of memory cells located in the middle of the memory string, i.e., the memory cells C4 and C5. Therefore, some of the memory cells C1 to C8, included in the memory string, e.g., the memory cells C1 to C4 are coupled in series between the source select transistor SST and the pipe cell PC to form a first memory cell group. The other memory cells C5 to C8 are coupled in series between the drain select transistor DST and the pipe cell PC and form a second memory cell group.

The pipe cell PC is formed on a substrate. The drain select transistor DST and the memory cells C1 to C4 of the first memory cell group are arranged in series between the bit line BL and the pipe cell PC in a vertical direction to the substrate. The source select transistor SST and the memory cells C5 to C8 of the second memory cell group are arranged in series between the source line SL and the pipe cell PC in the vertical direction to the substrate. The number of memory cells of the first memory cell group may be equal to or different from the number of memory cells of the second memory cell group. Since the memory cells C1 to C8 are arranged in the vertical direction to the substrate, a channel direction of the memory cells C1 to C8 is vertical to the substrate. In addition, since the memory cells C1 to C8 of the memory string are divided into the first and second memory cell groups, a single memory string includes two vertical sections of a channel layer vertical to the substrate.

The pipe cell PC has substantially the same configuration as each of the memory cells C1 to C8 and electrically couples a channel region of the memory cells C1 to C4 of the first memory cell group to a channel region of the memory cells C5 to C8 of the second memory cell group.

The peripheral circuit PERI is configured to perform erase operations on the memory cells and the pipe cells by supplying hot holes to the channel layers.

The control circuit 120 outputs a voltage control signal VCON to generate a voltage necessary to perform an erase operation and an erase verify operation in response to a command signal CMD externally input through the input/output circuit 160. The control circuit 120 outputs a PB control signal PBCON to control page buffers PB1 to PBk included in the page buffer group 140, depending on the kinds of operations. In addition, the control circuit 120 outputs a row address signal RADD and a column address signal CADD in response to an address signal ADD externally received through the input/output circuit 160.

The control circuit 120 includes a counter 122 for counting the number of times an erase operation has been performed on the memory cells. According to some embodiments, the control circuit 120 outputs the voltage control signal VCON and the PB control signal PBCON so as to perform an erase operation on the pipe cell during the erase operation of the memory cells. More specifically, the control circuit 120 outputs the voltage control signal VCON and the PB control signal PBCON so as to reduce threshold voltages of the memory cells and subsequently reduce threshold voltages of the pipe cell after a predetermined time period has passed. According to some embodiments, the control circuit 120 outputs the voltage control signal VCON and the PB control signal PBCON so that the erase operation is performed on the pipe cell based on the number of times the erase operation has been performed on the memory cells. More specifically, the control circuit 120 outputs the voltage control signal VCON and the PB control signal PBCON so that the erase operation is performed on the pipe cell when the counted number of times the erase operation has been performed on the memory cells reaches a predetermined number.

The voltage supply circuit 130 applies operating voltages Vop necessary for the erase operations on the memory cells and the pipe cell to local lines including a drain selection line DSL, word lines WL1 to WL8, a pipe gate PG, a source selection line SSL and the source line SL of a selected memory block in response to the voltage control signal VCON of the control circuit 120.

More specifically, in order to supply hot holes to the channel layers, the voltage supply circuit 130 applies a hot hole supply voltage to the source line SL under a condition that the word lines WL1 to WL8 of the memory cells and the pipe gate PG of the pipe cell are floated. According to some embodiments, when hot holes are supplied to the channel layer, the voltage supply circuit 130 applies an erase voltage to the source line SL, discharges the word lines WL1 to WL8 and discharges the pipe gate PG after a predetermined period of time has passed since the discharge of the word lines WL1 to WL8. According to some embodiments, when hot holes are supplied to the channel layers, the voltage supply circuit 130 applies an erase voltage to the source line SL and discharges the pipe gate PG. The voltage supply circuit 130 includes a voltage generator and a row decoder.

The voltage generator outputs operating voltages to global lines in response to the voltage control signal VCON of the control circuit 120 in order to perform an erase operation and an erase verify operation on the memory cells and the pipe cell.

The row decoder couples the global lines to local lines DSL, WL1 to WL8, PG, SSL and SL in response to the row address signals RADD of the control circuit 120 so that the operating voltages, output from the voltage generator to the global lines, are transferred from the memory array 110 to the local lines DSL, WL1 to WL8, PG, SSL and SL of the selected memory block.

The page buffer group 140 includes a plurality of page buffers that are coupled to the memory array 110 through the bit lines BL. The page buffers of the page buffer group 140 selectively precharge the bit lines BL in response to data for storing in the memory cells C1 to C8 or sense voltages of the bit lines BL in order to read data from the memory cells C1 to C8 in response to the PB control signal PBCON of the control circuit 120. The page buffer group 140 transfers information about the number of times (CS) the erase operation has been performed on the memory cells to the control circuit 120.

The column selection circuit 150 selects the page buffers included in the page buffer group 140 in response to the column address signal CADD output from the control circuit 120. Specifically, the column selection circuit 150 sequentially transfers data to be stored in the memory cells to the page buffers in response to the column address signal CADD. In addition, the column selection circuit 150 sequentially selects the page buffers, in response to the column address signal CADD, so that the data of the memory cells, latched in the page buffers during a read operation, may be externally output.

The input/output circuit 160 transfers the data to the column selection circuit 150 in order to input externally received data to the page buffer group 140 for storing in the memory cells during a program operation in response to control of the control circuit 120. When the column selection circuit 150 transfers the data from the input/output circuit 160 to the page buffers of the page buffer group 140 according to the above-described method, the page buffers store the input data in an internal latch circuit. In addition, during the read operation, the input/output circuit 160 externally outputs the data from the page buffers of the page buffer group 140 through the column selection circuit 150.

The structure of the semiconductor device including three-dimensional memory strings is described below in detail.

Figure 3:
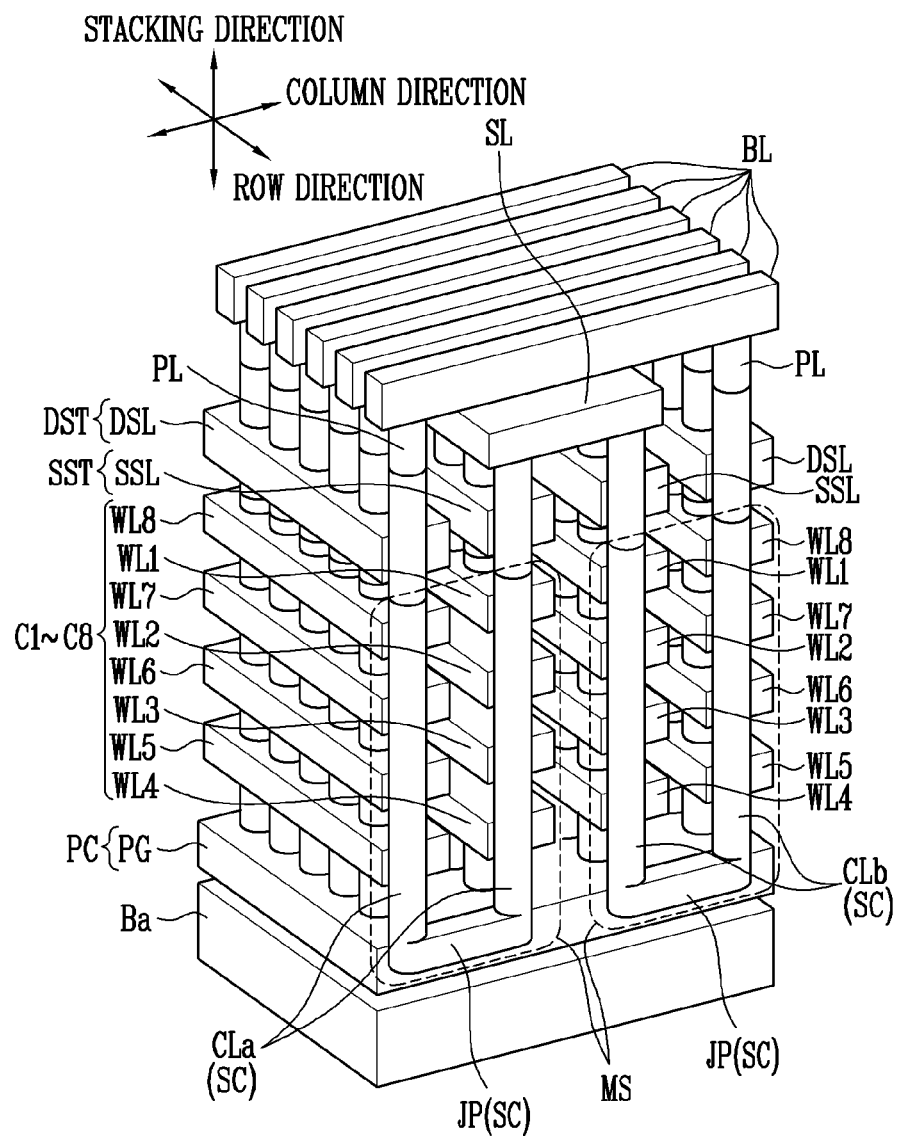
FIG. 3 is a perspective view of a structure of the memory block realized with one or more memory strings of FIG. 2.

FIG. 3 is a perspective view of the structure of a memory block realized with one or more memory strings of FIG. 2. Specifically, FIG. 3 is a perspective view of a portion of a memory block included in a memory array of a semiconductor memory device in accordance with some embodiments. In the example shown in FIG. 3, the memory block includes 6×2 memory strings MS, 6×2 source select transistors SST and 6×2 drain select transistors DST.

Referring to FIG. 3, the memory block includes a plurality of memory strings MS. Each of the memory strings MS includes a plurality of electrically rewritable memory cells, e.g., the memory cells C1 to C8, which are coupled in series with each other. The memory cells C1 to C8 that constitute the memory string MS are formed by stacking a plurality of semiconductor layers. Each of the memory strings MS includes a channel layer SC, the word lines WL1 to WL8 and the pipe gate PG. The channel layer SC may have a three-dimensional U-shaped structure and include, for example, a polysilicon layer doped with 5-valence impurities.

The channel layer SC has the U-shaped structure when seen in a row direction. The U-shaped channel layer SC includes a pair of columnar portions CLa and CLb and a joining portion JP. The columnar portions CLa and CLb extend in a substantially vertical direction to a semiconductor substrate Ba. The joining portion JP couples lower portions of the columnar portions CLa and CLb to each other. The channel layer SC extends along the memory string MS from the memory cells C1-C4 in the first memory cell group to the pipe cell PC then to the memory cells C5-C8 in the second memory cell group. Each of the columnar portions CLa and CLb may be in the shape of a cylindrical or square column. The row direction is orthogonal to a stacking direction, and a column direction to be described below is orthogonal to the stacking direction and the row direction.

The U-shaped channel layer SC is arranged so that a line connecting central axes of a pair of the columnar portions CLa or CLb is in parallel with the column direction. In addition, the U-shaped channel layers SC are arranged so that a matrix is formed in a plane defined by the row direction and the column direction.

The word lines WL1 to WL8, formed at different levels, extend in parallel with the row direction. The word lines WL1 to WL8, formed at different levels, include lines that are insulated and separated from each other and have a predetermined pitch in the column direction. The word line WL1 is formed in the same plane as the word line WL8. In substantially the same manner, the word line WL2 is formed in the same plane as the word line WL7, the word line WL3 is formed in the same plane as the word line WL6, and the word line WL4 is formed in the same plane as the word line WL5.

Gates of the memory cells C1 to C8 that are located at the same positions in the column direction and form lines in the row direction are coupled to the same word lines WL1 to WL8, respectively. Though not illustrated, each of the word lines WL1 to WL8 has a stepped end portion in the row direction. The word lines WL1 to WL8 surround the plurality of columnar portions that are arranged next to each other in the row direction.

An ONO (Oxide-Nitride-Oxide) layer (not illustrated) is formed between the word lines WL1 to WL8 and the columnar portions CLa and CLb. The ONO layer includes a tunnel insulating layer adjacent to the columnar portions CLa and CLb, a charge storage layer adjacent to the tunnel insulating layer, and a blocking insulating layer adjacent to the charge storage layer. The charge storage layer functions to accumulate charges in the same manner as a floating gate. In some embodiments, the charge storage layer surrounds the entire surfaces of the columnar portions CLa and CLb and the joining portion JP, and each of the word lines WL1 to WL8 surrounds the charge storage layer.

The drain select transistor DST includes the columnar channel layer CLa and the drain selection line DSL. The columnar channel layer CLa extends in a vertical direction to the semiconductor substrate Ba.

The drain selection line DSL is arranged above the uppermost word line WL8. The drain selection line DSL extends in parallel with the row direction. The drain selection lines DSL may include repetitive lines with a predetermined pitch so that the lines may alternate with each other in the column direction while interposing the source selection lines SSL therebetween. The drain selection line DSL surrounds the plurality of columnar channel layers CLa that are arranged next to each other in the row direction with a gap interposed therebetween.

The source select transistor SST includes the columnar channel layer CLb and the source selection line SSL. The source selection line SSL is arranged above the uppermost word line WL1. The source selection line SSL extends in parallel with the row direction. The source selection lines SSL may include repetitive lines with a predetermined pitch so that the lines may alternate with each other in the column direction while interposing the drain selection lines DSL therebetween. The source selection line SSL surrounds the plurality of the columnar channel layers CLb that are arranged in a line in the row direction with a gap interposed therebetween.

The pipe gate PG extends two-dimensionally in the row direction and the column direction so as to cover lower portions of the plurality of joining portions JP.

The columnar channel layers CLb are formed next to each other in the column direction. Upper portions of a pair of the columnar channel layer CLb are coupled to the source line SL. The source line SL is commonly coupled to a pair of the columnar channel layers CLb.

The bit lines BL may be formed at upper end portions of the columnar channel layers CLa and coupled to the columnar channel layers CLa through plugs PL. Each of the bit lines B is formed over the source line SL. The bit lines BL include repetitive lines that extend in the column direction and are spaced apart by a predetermined distance in the row direction.

In a two-dimensional memory string, when a high voltage of approximately 20V is applied to a P well during an erase operation, a high voltage difference between the P well and floating gates allows electrons stored in the floating gates of the memory cells to be erased. However, in a three-dimensional memory string, an erase operation is performed by a different method.

Figure 4:
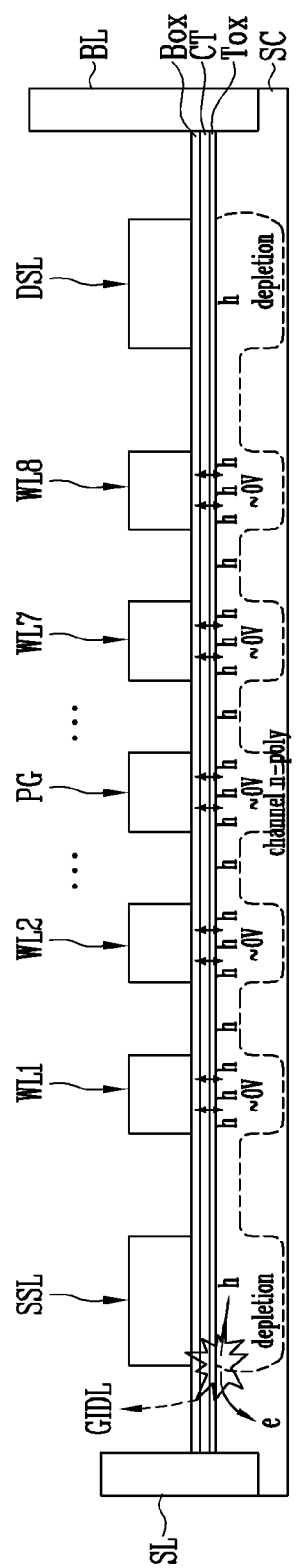
FIG. 4 is a cross-sectional view of a memory string illustrated in FIG. 3 in operation.

FIG. 4 is a cross-sectional view of the memory string of FIG. 3 in operation. It should be noted that FIG. 4 does not reflect the three-dimensional physical arrangement among the components of the memory string of FIG. 3.

Referring to FIG. 4 the ONO layer including a tunnel insulating layer Tox, a charge storage layer CT and a block insulating layer Box is formed between the word lines WL1 to WL8 and the channel layer SC. The charge storage layer CT includes, for example, a nitride layer.

An insufficient amount of charge in the channel layer SC inhibits a high potential difference. Therefore, it may be difficult to erase the memory cells. A threshold voltage of the memory cells may be reduced when electron-hole pairs are generated after a sufficient amount of time has passed. However, since it takes more than a few seconds to generate electron-hole pairs, specifications desired by the user in some situations are not met.

In order to meet these specifications, hot holes are sufficiently injected to form a high electric field when a phenomenon known as gate induced drain leakage (GIDL) is caused by forcibly controlling voltages being applied to the source line SL and the source selection line SSL. As a result, the threshold voltage of the memory cells may be is reduced so that the memory cells are erased.

Figure 5:
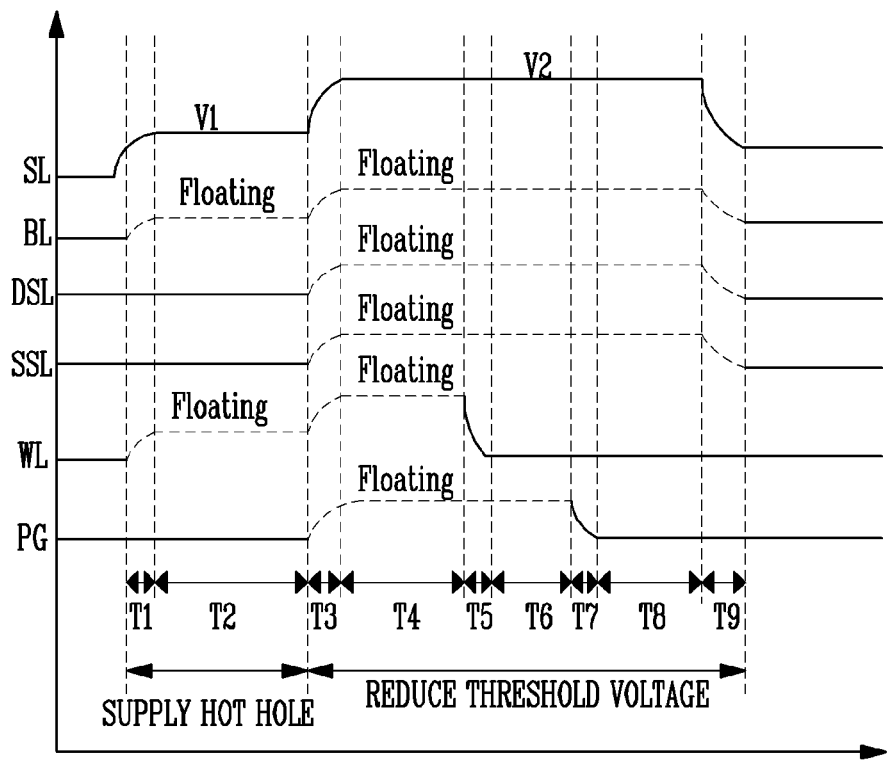
FIG. 5 is a waveform diagram illustrating a method of operating a semiconductor memory device according to some embodiments.

FIG. 5 is a waveform diagram illustrating a method of operating a semiconductor memory device according to some embodiments of the present disclosure.

According to a method of operating a semiconductor memory device according to some embodiments of the present disclosure, an erase operation is performed on a pipe cell during an erase operation of memory cells.

Referring to FIG. 5, hot holes h are supplied during time periods T1 and T2. The voltage supply circuit sets the word lines WL to a floating state and applies a ground voltage to the source selection line SSL. In addition, when a hot hole supply voltage V1 is applied to the source line SL, the hot holes h are supplied to the channel layer SC by a GIDL current. A potential of the bit line BL is increased by the hot holes h. The voltage supply circuit applies the ground voltage to the drain selection line DSL and the pipe gate PG.

When the hot holes h are injected into the channel layer SC, the threshold voltages of the memory cells and the pipe cell are reduced during time periods T3 to T9. The control circuit controls the voltage supply circuit during the time periods T3 to T4 so that the source selection line SSL is in a floating state and an erase voltage V2 is applied to the source line SL. When the erase voltage V2 is applied, voltages of the source selection line SSL and the word lines WL1 to WL8 in the floating state increase due to a capacitor coupling phenomenon. The control circuit controls the voltage supply circuit so that the drain selection line DSL and the pipe gate PG are in the floating state.

Subsequently, when the voltage supply circuit discharges the word lines WL1 to WL8 during the time periods T5 and T6, for example, the voltage supply circuit applies the ground voltage to the word lines WL1 to WL8, the voltage difference between the word lines WL1 to WL8 and the channel layer SC increases sufficiently so that the threshold voltage of memory cells coupled to the word lines WL1 to WL8 is reduced.

Subsequently, the voltage supply circuit discharges the pipe gate PG, for example, the voltage supply circuit applies a ground voltage to the pipe gate PG, during the time periods T7 to T8, the voltage difference between the pipe gate PG and the channel layer SC increases sufficiently so that the threshold voltage of the pipe cell is reduced.

During the time period T9, the supply of the erase voltage V2 is stopped, thereby completing the erase operation.

As described above, the pipe cell PC has substantially the same configuration as the memory cells. Therefore, the more number of times the program operation is performed on the memory cells, the more number of electrons are trapped in the charge storage layer CT of the pipe cell. As a result, the threshold voltage of the pipe cell increases. If an erase operation is not performed on the pipe cell PC, the more number of times the program operation is performed, the greater likelihood of problems caused by deterioration of the pipe cell PC. Therefore, according to a method of operating a semiconductor memory device according to some embodiments of the present disclosure, since an erase operation is performed on a pipe cell while an erase operation is being performed on memory cells, a threshold voltage of the pipe cell is reduced. As a result, the reliability of the memory string and/or the semiconductor memory device is improved and a sufficient cell current is ensured.

Figure 6:
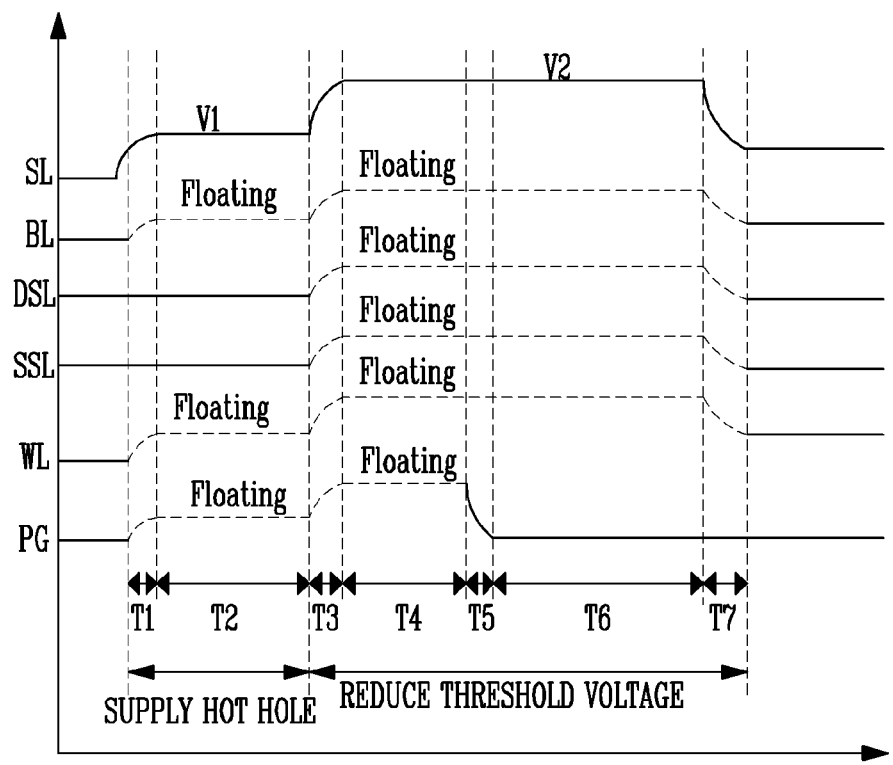
FIG. 6 is a waveform diagram illustrating a method of operating a semiconductor memory device according to some embodiments.

FIG. 6 is a waveform diagram illustrating a method of operating a semiconductor memory device according to some embodiments of the present disclosure.

A method of operating a semiconductor memory device according to some embodiments of the present disclosure includes counting the number of times an erase operation has been performed on the memory cells and performing an erase operation on the pipe cell when the counted number reaches a predetermined number.

Referring to FIG. 6, hot holes are supplied during the time periods T1 and T2. The voltage supply circuit sets the word lines WL to the floating state and applies the ground voltage to the source selection line SSL. In addition, when the hot hole supply voltage V1 is applied to the source line SL, the hot holes h are supplied to the channel layer SC by a GIDL current. The hot holes h cause the potential of the bit line BL to increase. The voltage supply circuit applies the ground voltage to the drain selection line DSL and the pipe gate PG.

When the hot holes h are injected into the channel layer SC, a threshold voltage of the pipe cell is reduced during the time periods T3 to T7. The control circuit controls the voltage supply circuit during the time periods T3 and T4 so that the source selection line SSL is in the floating state and the erase voltage V2 is applied to the source line SL. When the erase voltage V2 is applied, the voltages of the source selection line SSL, the word lines WL1 to WL8 and the pipe gate PG in the floating state are increased by the capacitor coupling phenomenon. The control circuit controls the voltage supply circuit so that the drain selection line DSL is in a floating state.

Subsequently, when the voltage supply circuit discharges the pipe gate PG, for example, when the voltage supply circuit applies a ground voltage to the pipe gate PG, during the time periods T5 and T6, the voltage difference between the pipe gate PG and the channel layer SC increases sufficiently so that the threshold voltage of the pipe cell is reduced. The supply of the erase voltage V2 is successively stopped during the time period T7, thereby completing the erase operation.

The control circuit includes the counter for counting the number of times the erase operation has been performed on the memory cells. The control circuit controls the voltage supply circuit so that the erase operation is performed on the pipe cell based on the counted number of times the erase operation has been performed on the memory cells. Specifically, the control circuit controls the voltage supply circuit so that the erase operation is performed on the pipe cell when the counted number of times the erase operation has been performed on the memory cells reaches the predetermined number.

As described above, according to a method of operating a semiconductor memory device according to some embodiments of the present disclosure, an erase operation is performed on the pipe cell based on the number of times an erase operation has been performed on the memory cells, so that the cell current is stably maintained, avoiding or mitigating deterioration of the pipe cell due to repetition of the program operation.

Figure 7:
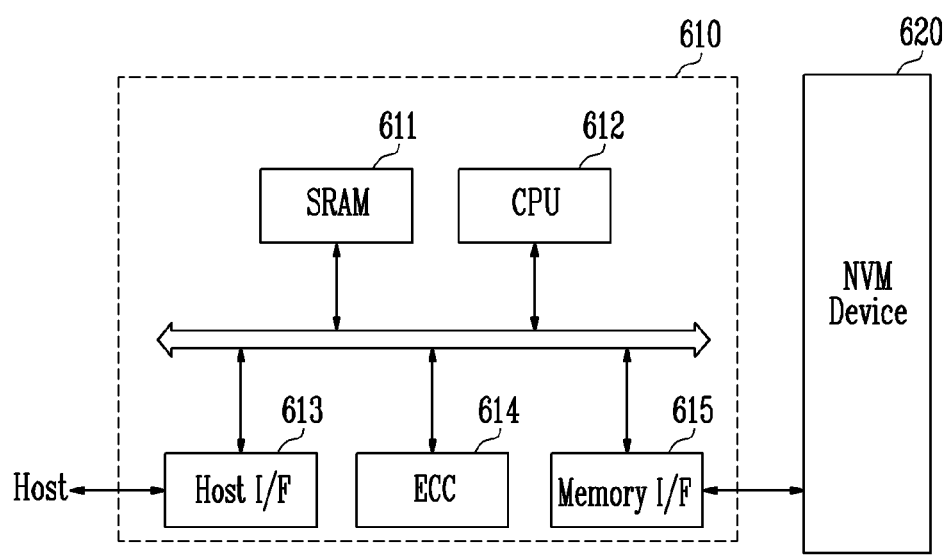
FIG. 7 is a schematic block diagram of a memory system according to some embodiments.

FIG. 7 is a schematic block diagram of a memory system 600 according to some embodiments of the present disclosure.

Referring to FIG. 7, the memory system 600 includes a semiconductor memory device 620 and a controller 610.

The non-volatile memory device 620 may be configured into the above-described semiconductor memory device and may be operated by the above-described method for compatibility with the memory controller 610. The memory controller 610 may be configured to control the non-volatile memory device 620. The memory system 600 having the above-described configuration may be a memory card or a solid state disk (SSD) in which the non-volatile memory device 620 and the memory controller 610 are combined. A SRAM 611 functions as an operation memory of a CPU 612. The host interface 613 includes a data exchange protocol of a host being coupled to the memory system 600. An ECC 614 detects and corrects errors included in a data read from the non-volatile memory device 620. The memory interface 615 interfaces with the non-volatile memory device 620. The CPU 612 performs the general control operation for data exchange of the memory controller 610.

Though not illustrated in FIG. 7, the memory controller 610 may further include ROM that stores code data to interface with the host. In addition, the non-volatile memory device 620 may be a multi-chip package of a plurality of flash memory chips. The memory system 600 may be provided as a storage medium having high reliability and low error rate. The flash memory device according to some embodiments of the present disclosure may be provided in a memory system such as a semiconductor disk device (a solid state disk (SSD)) on which research has been actively conducted. For example, the memory controller 110 may communicate with an external device, e.g., a host, through one of the interface protocols including USB, MMC, PCI-E, SATA, PATA, SCSI, ESDI and IDE.

Figure 8:
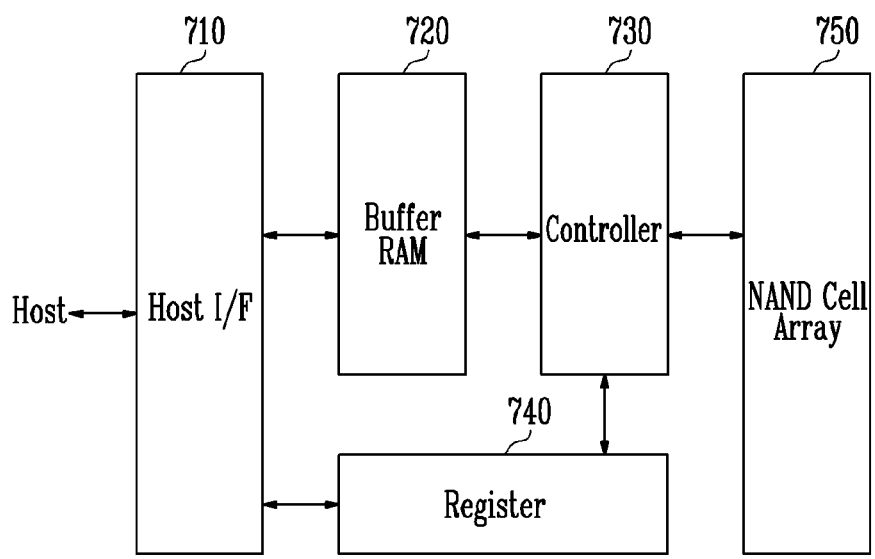
FIG. 8 is a schematic block diagram of a fusion memory device or a fusion memory system configured to perform a program operation according to some embodiments.

FIG. 8 is a schematic block diagram of a fusion memory device or a fusion memory system that performs a program operation according to the aforementioned various embodiments. For example, technical features of the present disclosure may be applied to an OneNand flash memory device 700 as the fusion memory device.

The OneNand flash memory device 700 includes a host interface (I/F) 710, a buffer RAM 720, a controller 730, a register 740 and a NAND flash cell array 750. The host interface 710 is configured to exchange various types of information with a device through a different protocol. The buffer RAM 720 has built-in codes for driving the memory device or temporarily store data. The controller 730 is configured to control read and program operations and every state in response to a control signal and a command that are externally given. The register 740 is configured to store data including instructions, addresses and configurations defining a system operating environment in the memory device. The NAND flash cell array 750 includes operating circuits including non-volatile memory cells and page buffers. In response to a write request from a host, the OneNAND flash memory device 700 programs data in the aforementioned manner.

Figure 9:
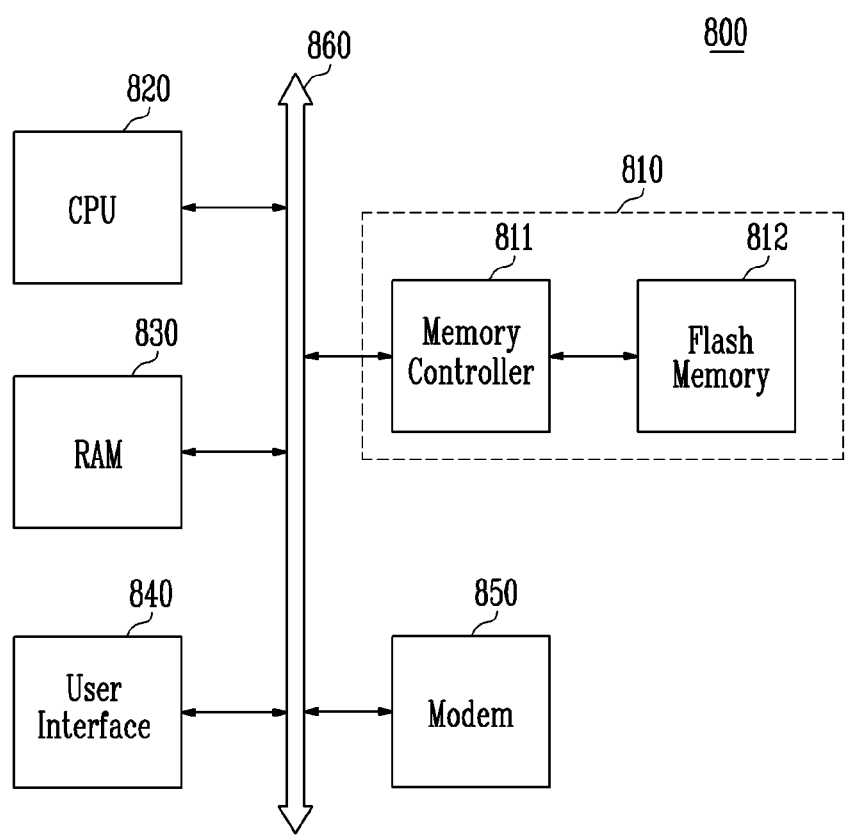
FIG. 9 is a schematic block diagram of a computing system including a flash memory device according to some embodiments.

FIG. 9 is a schematic block diagram of a computing system including a flash memory device 812 according to some embodiments of the present disclosure.

A computing system 800 according to some embodiments of the present disclosure includes a microprocessor (CPU) 820, a RAM 830, a user interface 840, a modem 850, such as a baseband chipset, and a memory system 810 that are electrically coupled to a system bus 860. In addition, if the computing system 800 is a mobile device, then a battery (not illustrated) may be provided to apply operating voltages to the computing system 800. Though not illustrated in FIG. 9, the computing system 800 may further include application chipsets, a Camera Image Processor (CIS), or a mobile DRAM. The memory system 810 may form a Solid State Drive/Disk (SSD) that uses a non-volatile memory to store data. The memory system 810 may be provided as a fusion flash memory, e.g., an OneNAND flash memory.

According to some embodiments of the present disclosure, a semiconductor memory device and a method of operating the same stably maintain a cell current by performing an erase operation on pipe cells and prevent a disturbance phenomenon caused by deterioration of the pipe cells due to repetition of a program operation. Therefore, data reliability is improved.

The invention claimed is:

1. A semiconductor memory device, comprising:
a memory string including a pipe cell, a plurality of memory cells arranged in series between a bit line and the pipe cell and between a source line and the pipe cell in a vertical direction to the pipe cell, and a channel layer with a three-dimensional U-shaped structure connecting the plurality of memory cells and the pipe cell; and
a peripheral circuit configured to perform an erase operation on the plurality of memory cells and the pipe cell,
wherein the peripheral circuit is further configured to decrease, when hot holes are supplied to the channel layer, a threshold voltage of the pipe cell to discharge trapped electrons when a gate electrode of the pipe cell is floated.

2. The semiconductor memory device of claim 1, wherein the peripheral circuit is further configured to
count a number of times the erase operation has been performed on the plurality of memory cells, and
apply, when the counted number exceeds a reference value, a ground voltage to the pipe cell to discharge trapped electrons of the pipe cell to the channel layer.

3. The semiconductor memory device of claim 1, wherein the peripheral circuit is further configured to apply a ground voltage to the pipe cell to discharge trapped electrons of the pipe cell to the channel layer.

4. The semiconductor memory device of claim 1, wherein the peripheral circuit is further configured to apply, when a pre-determined time lapses, a ground voltage to the pipe cell to discharge trapped electrons of the pipe cell to the channel layer.

5. The semiconductor memory device of claim 1, wherein the peripheral circuit includes a counter for counting a number of times the erase operation has been performed on the plurality of memory cells.

6. The semiconductor memory device of claim 1, wherein the peripheral circuit is further configured to perform the erase operation on the pipe cell by supplying hot holes to the channel layer.

7. The semiconductor memory device of claim 1, wherein the peripheral circuit is configured to discharge word lines before discharging the gate electrode of the pipe cell.

8. A method of operating a semiconductor memory device including a pipe cell, a plurality of memory cells arranged in series between a bit line and the pipe cell and between a source line and the pipe cell in a vertical direction to the pipe cell respectively, and a channel layer with a three-dimensional U-shaped structure connecting the plurality of memory cells and the pipe cell, the method comprising:
 applying a pre-charge voltage to the source line to supply hot holes to the channel layer;
 applying an erase voltage to the source line to increase voltages of word lines of the plurality of memory cells;
 applying a ground voltage to the word lines of the plurality of memory cells to discharge trapped electrons to the channel layer; and
 decreasing, when the hot holes are supplied to the channel layer, a threshold voltage of the pipe cell.

9. The method of claim 8, wherein the decreasing the threshold voltage of the pipe cell comprises:
 counting a number of times an erase operation has been performed on the plurality of memory cells; and
 applying, when the counted number exceeds a reference value, the ground voltage to the pipe cell to discharge trapped electrons of the pipe cell to the channel layer.

10. The method of claim 8, wherein the decreasing the threshold voltage of the pipe cell comprises:
 applying the ground voltage to the pipe cell to discharge trapped electrons of the pipe cell to the channel layer.

11. The method of claim 8, wherein the decreasing the threshold voltage of the pipe cell comprises:
 applying, when a pre-determined time lapses, the ground voltage to the pipe cell to discharge trapped electrons of the pipe cell to the channel layer.

12. The method of claim 8, wherein the decreasing the threshold voltage of the pipe cell comprising:
 applying, when the ground voltage is applied to the word lines, the ground voltage to the pipe cell to discharge trapped electrons of the pipe cell to the channel layer.

13. A semiconductor memory device, comprising:
 a substrate;
 a memory string including
  a pipe cell formed on the substrate,
  a plurality of memory cells including
   a first group of memory cells arranged in series between a bit line and the pipe cell in a vertical direction to the substrate, and
   a second group of memory cells arranged in series between a source line and the pipe cell in the vertical direction to the substrate, and
  a channel layer extending along the memory string from the memory cells in the first group to the pipe cell then to the memory cells in the second group; and
 a peripheral circuit configured to perform an erase operation on the pipe cell,
 wherein, in the erase operation, the peripheral circuit is further configured to
  apply a pre-charge voltage to the source line to supply hot holes to the channel layer,
  apply an erase voltage to the source line to increase voltages of word lines of the plurality of memory cells,
  apply a ground voltage to the word lines of the plurality of memory cells to discharge trapped electrons to the channel layer, and
  decrease, when the hot holes are supplied to the channel layer, a threshold voltage of the pipe cell.

14. The semiconductor memory device of claim 13, wherein the peripheral circuit is configured to perform the erase operation on the pipe cell when the erase operation is performed on the memory cells.

15. The semiconductor memory device of claim 13, wherein the peripheral circuit is configured to perform the erase operation on the pipe cell when the erase operation has been performed on the memory cells a predetermined number of times.

* * * * *